United States Patent

[11] 3,566,145

[72] Inventor Edmund E. Goodale
Saratoga, Calif.
[21] Appl. No. 731,140
[22] Filed May 22, 1968
[45] Patented Feb. 23, 1971
[73] Assignee General Electric Company

[54] RECTIFIER CIRCUIT
11 Claims, 5 Drawing Figs.

[52] U.S. Cl. .......... 307/235, 307/232, 307/236, 307/251, 307/255, 307/317, 330/13
[51] Int. Cl. .......... H03k 5/20
[50] Field of Search .......... 307/235, 229, 236, 232, 251, 255, 262, 313; 330/13, 17, 28; 329/163, 168, 169

[56] References Cited

UNITED STATES PATENTS

| | | | |
|---|---|---|---|
| 3,188,574 | 6/1965 | Parmer | 330/17X |
| 3,392,341 | 7/1968 | Burns | 307/304X |
| 3,424,992 | 1/1969 | Zielinski et al. | 330/13 |
| 3,469,202 | 9/1969 | Priddy | 330/28 |
| 3,471,714 | 10/1969 | Gugliotti, Jr. et al. | 307/255X |
| 3,475,691 | 10/1969 | Zollinger et al. | 330/13X |

FOREIGN PATENTS

| | | | |
|---|---|---|---|
| 931,864 | 7/1963 | Great Britain | 307/229 |

*Primary Examiner*—Stanley T. Krawczewicz
*Attorneys*—Ivor J. James, Jr., Samuel E. Turner, John R. Duncan, Frank L. Neuhauser, Oscar B. Waddell and Melvin M. Goldenberg

ABSTRACT: A rectifier circuit utilizing a feedback amplifier arrangement to minimize nonlinearity, offset and temperature dependence and to provide wide dynamic range.

INVENTOR:
EDMUND E. GOODALE
BY: Samuel E. Turner
ATTORNEY

RECTIFIER CIRCUIT

In an ideal, linear bipolar or alternating current rectifier the DC (direct current) output would be directly proportional to the absolute value of the input signal over a dynamic range from zero input signal up to the input signal limitation of the circuit. However prior well-known rectifier circuits are notoriously nonlinear for small input signals and the input signal is offset from zero at zero output signal. For example, a semiconductor rectifying junction exhibits a threshold on the order of a few tenths of a volt below which there is no substantial conduction. Furthermore, because this threshold is a function of temperature, prior rectifier circuits often suffer changes in operating characteristics with temperature.

This object of this invention is to provide a stable rectifier circuit having a wide dynamic range and in which offset and nonlinearity is minimized.

This and other objects are achieved in accordance with the invention by utilizing a pair of three-terminal current control devices having complementary current flow characteristics, such as a pair of complementary transistors, as rectifying elements in a feedback amplifier arrangement. The bipolar or AC (alternating current) input signal to be rectified is amplified, inverted and applied to the bases of the complementary transistors. A feedback line connects the emitters of the transistors to the input terminal of the amplifier. Because of the feedback, the input current is constrained to flow in the feedback line. Thus one of the transistors conducts in response to positive input signals while the other transistor conducts in response to negative input signals. A rectified output current is thus furnished in the collector circuit of each transistor.

The invention is described more specifically hereinafter with reference to the accompanying drawing wherein.

Figure 1:
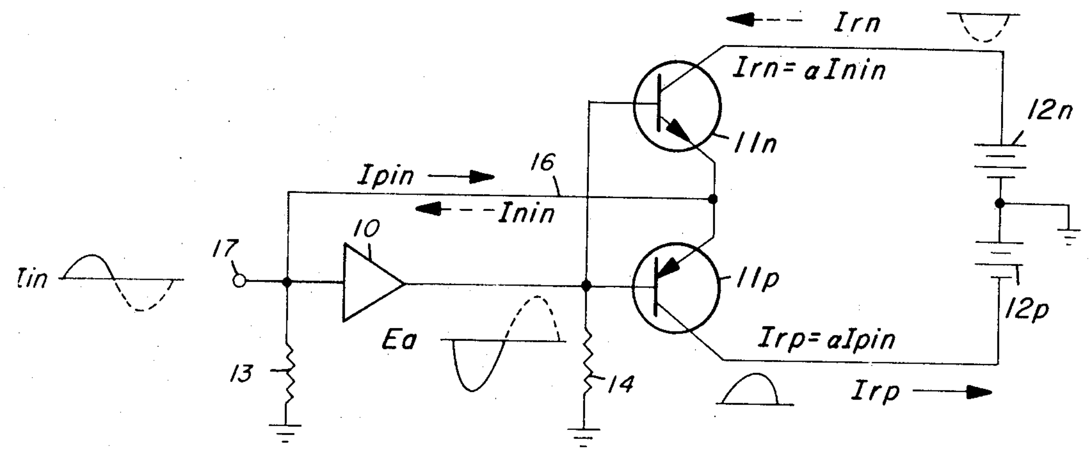
FIG. 1 is a schematic diagram of the basic form of the invention.

A basic form of the invention is shown in the simplified schematic circuit of FIG. 1. The basic components of the circuit include a high gain-inverting amplifier 10, a pair of current control devices in the form of complementary transistors **11*n* and 11*p* and a pair of current supply sources 12*n* and 12*p*. A resistor 13, connected to the input terminal of amplifier 10, and to ground or other source of reference potential, is assumed to be of relatively low impedance compared to the input impedance of amplifier 10. Similarly, a resistor 14 is assumed to be of relatively low resistance compared to the input impedance of the transistors 11*n* and 11*p*. A feedback line 16 connects the emitters of transistors 11*n* and 11*p* to the input terminal of amplifier 10. In the quiescent condition, the bases and emitters of transistors 11*n* and 11*p*** are at the same potential and the transistors are therefore nonconducting.

An AC input current Iin, to be rectified, is applied through an input terminal 17 to the input terminal of amplifier 10. (A full wave of an example input signal is illustrated wherein the positive portion is shown with a solid line and the negative portion is shown a dashed line.) In response to the voltage developed across resistor 13 by the input current Iin, the amplifier 10 produces an amplified voltage E*a* across resistor 14. (It is assumed in FIG. 1 that amplifier 10 also acts as an inverter although this is not a necessary condition; the inversion required for negative feedback could be provided by a separate element.) Thus in response to a positive portion of Iin, input current Iin, a negative voltage is applied to the bases of transistors **11*n* and 11*p*. This negative voltage causes the PNP transistor 11*p* to conduct while the NPN transistor 11*n* remains cutoff. The positive portion Iin of the input current flows through the feedback line 16 to the emitter of transistor 11*p* and a unidirectional output current Irp flows in the emitter circuit of transistor 11*p*, the magnitude of the output current Irp being equal to the alpha ($\alpha$) of transistor 11*p*** times the emitter current Ipin.

In response to a negative portion of the input current Iin, the voltage E*a* is positive at the bases of transistors **11*n* and 11*p*. In this case, transistor 11*p* is cutoff and transistor 11*n* conducts whereby a unidirectional output current Irn is produced in the collector circuit of transistor 11*n*, the magnitude of the output current Inp being equal to the alpha of transistor 11*n*** times the emitter current Inin.

Figure 2:
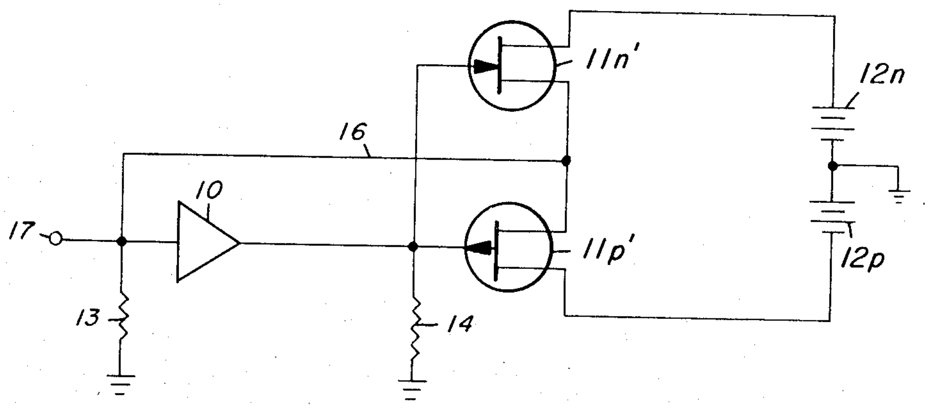
FIG. 2 is a schematic diagram of the basic circuit of the invention implemented with field effect transistors.

While bipolar transistors are shown in FIG. 1, equivalent current flow control devices can be used. For example, the invention can be implemented with FET's (field effect transistors) as shown in FIG. 2 wherein the gates of complementary FET's **11*n*' (N type) and 11*p*' (P type) are connected to receive the output signal from amplifier 10, the sources of the FET's are connected to the feedback line 16** and the rectified currents flow in the drain circuits of the FET's.

While full-wave rectifier arrangements are shown herein, one of the current control devices **11*n* or 11*p*** may be omitted if only half-wave rectification is desired.

Figure 3:
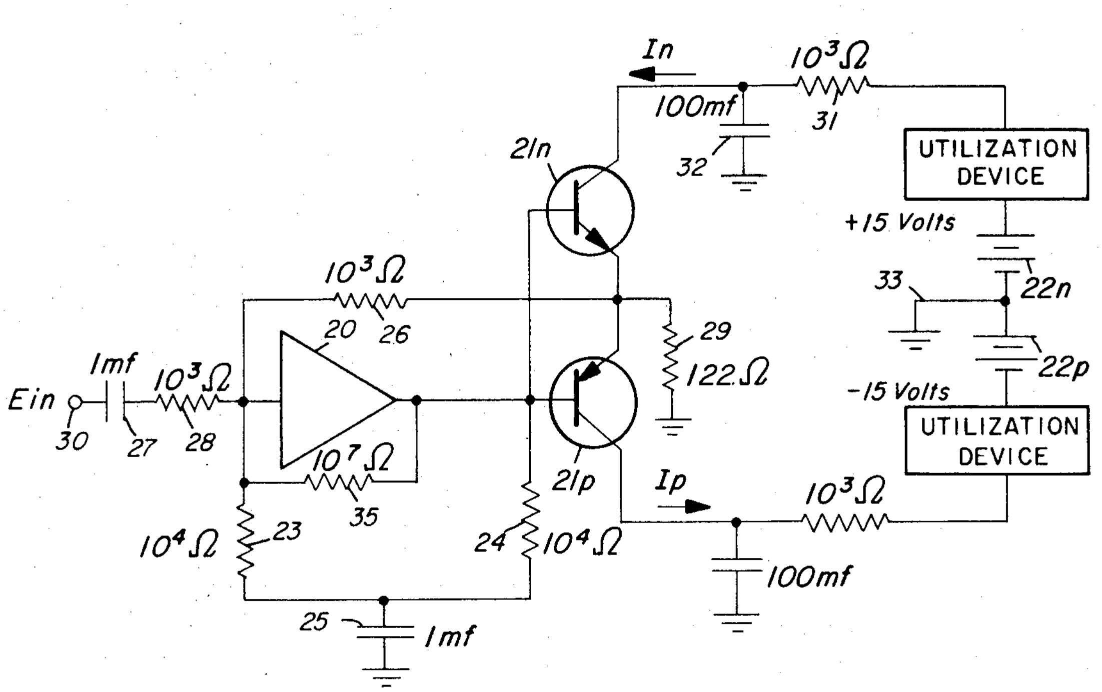
FIG. 3 is a schematic diagram of an embodiment of the invention.

An embodiment of the rectifier circuit of the invention is schematically illustrated in FIG. 3. The circuit includes an amplifier 20, a pair of complementary transistors **21*n* and 21*p*. The NPN transistors 21*n* may be type 2N2484. The PNP transistor 21*p* may be a type 2N3799. The amplifier 20 may be, for example, Philbrick Researchers, Inc. operational amplifier PP45U. (This amplifier has a nominal gain of $10^5$. With a feedback resistor 35 of $10^7$ ohms the gain is about $10^4$. .) Typical values of resistors and capacitors are shown in FIG. 3. The given component values provide operation in the frequency range of about 8—16 kHz. For other frequency ranges, appropriate component values and an amplifier 20** appropriate for the desired frequency range may be selected.

An input signal to be rectified, indicated as Ein, is received at an input terminal 30. A capacitor 27 and a resistor 28 are connected in series between the input terminal 30 and the input terminal of amplifier 20. The capacitor 27 and resistor 28 serve to convert the input signal Ein to an input current. A resistor 23 serves as an input resistor for amplifier 20 while a resistor 24 serves as an input resistor for transistors **21*n* and 21*p*. Resistors 23 and 24 are connected to ground for AC signals by a capacitor 25. A resistor 26 is connected in a feedback path between the emitters of transistors 21*n* and 21*p* and the input terminal of amplifier 20**.

In the quiescent condition of the circuit the bases and emitters of transistors **21*n* and 21*p* are at the same potential and the transistors are therefore nonconducting. In response to a negative input signal Ein the amplifier 20 applies a positive signal to the bases of the transistors with the result that transistor 21*p* remains cutoff while the transistor 21*n*** conducts an output current I*n* in its collector circuit. In response to a position input signal Ein, the amplifier 20 applies a negative signal to the bases of the transistors. In this case a transistor **21*n* is cutoff and transistor 21*p*** conduits an output current I*n* in its collector circuit. The collector circuit of transistor **21*n* may include a series resistor 31 and a shunt capacitor 32** which function as a current averaging circuit to smooth the rectified current I*n*. A similar arrangement may be provided in the collector circuit of transistor **21*p*. The collector circuits also include utilization devices such as indicating meters or the like to utilize the rectified currents provided by transistors 21*n* and 21*p***.

In the simplified circuit of FIGS. 1 and 2 the output (collector) current is substantially equal to the alpha of the transistor times the emitter current in the feedback line 16. In the circuit of FIG. 3 a resistor 29, connected between the emitters of the transistors and ground, is provided to obtain a current gain in the transistors **21*n* and 21*p***. The amount of gain in collector currents I*n* and I*p* over the emitter current I*e* (through resistor 26) depends upon the ratio of the resistance of resistors 26 and 29 and is given approximately by the following expression $$Ie\frac{R26+R29}{R29}=In=Ip$$

For the circuit constants given in FIG. 3, the gain through transistors 21*n* and 21*p* is about 9.

Figure 4:
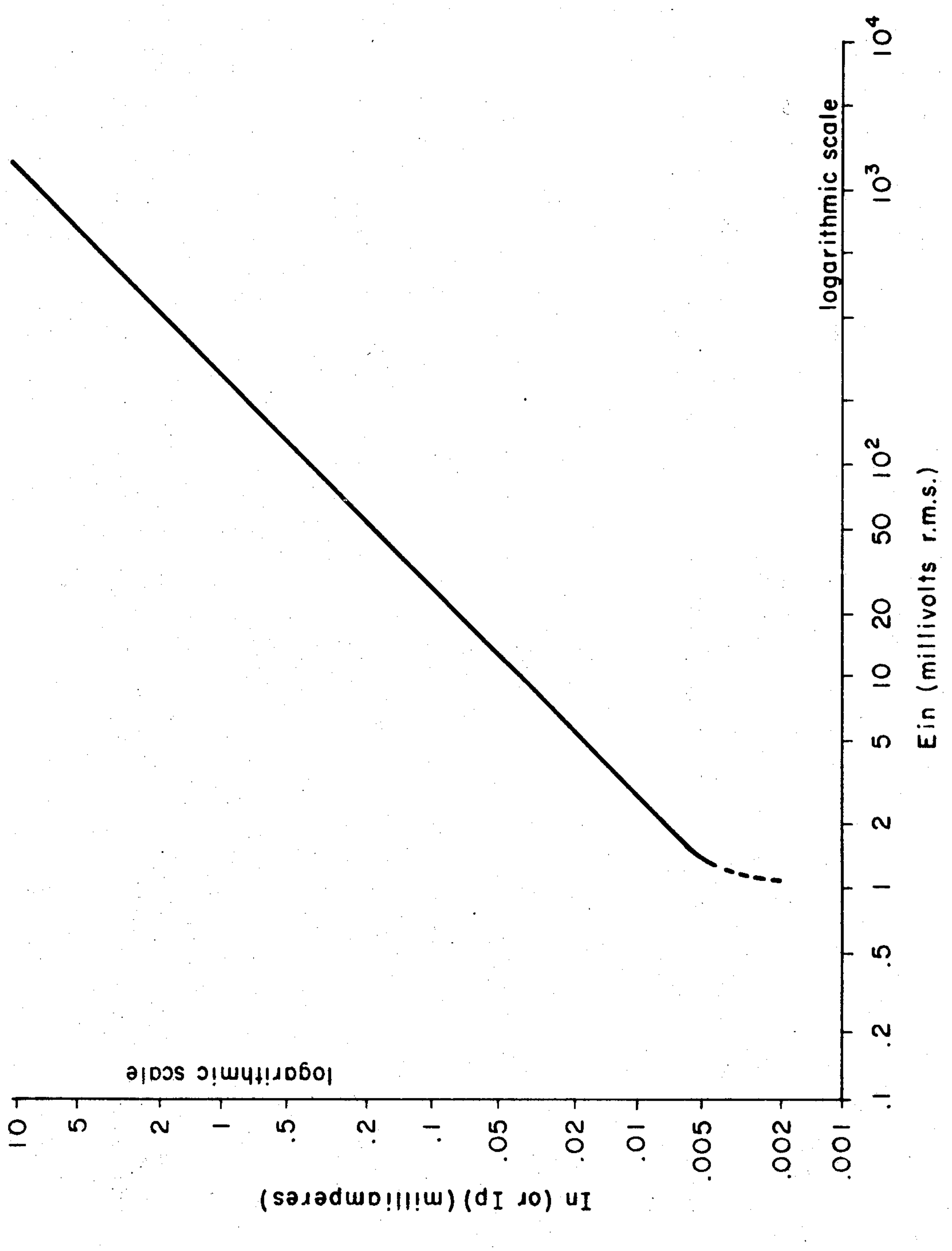
FIG. 4 is a graphical illustration of the performance of the circuit of FIG. 3.

The performance of the circuit of FIG. 3 is illustrated in FIG. 4 by a curve of the rectified output current I*n* (or I*p*) versus the input signal Ein. The circuit displays a threshold, or offset of about 1 millivolt. That is, the input signal Ein must be above one millivolt before the circuit provides a detectable rectified output current. This compares to offsets of 250—500 millivolts which are common for ordinary rectifier circuits. The curve is substantially a straight line for output currents from about .007 to at least 10 milliamperes. Thus the circuit provides linear rectification over an input signal range from 2 to at least 2500 millivolts, that is, a range of at least 1—1000. Because of the feedback and reduced offset, the rectifying characteristics of the circuit are substantially constance over wide changes in temperature.

Figure 5:
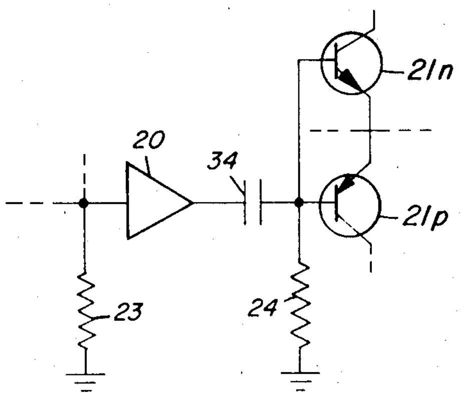
FIG. 5 illustrates a modification of the circuit of FIG. 3.

In the embodiment of FIG. 3 the amplifier 20 is DC coupled to the bases of transistors 21*n* and 21*p*. For some applications AC coupling may be desirable. This can be accomplished by inserting a capacitor 34 between amplifier 20 and transistors 21*n* and 21*p*, as shown FIG. 5. In this case the capacitor 25 is eliminated and resistors 23 and 24 are returned directly to ground.

Thus what has been described is a rectifier circuit which minimizes offset and which provides linear operation over a wide range and especially for relatively low input signals.

While illustrative embodiments of the invention have been described herein, modifications and adaptions thereof may be made by those skilled in the art without departure from the spirit and scope of the invention as defined by the following claims:

I claim:

1. A rectifier circuit comprising, the combination of: a signal input terminal for receiving a bipolar signal to be rectified; an amplifier including inverting means having an input terminal and an output terminal; means connecting said signal input terminal to said input terminal of said amplifiers; a current flow control device having at least three terminals including a first terminal adapted to receive signals for controlling the flow of current through said device, said device being zero biased whereby said device conducts substantially no current in the absence of a signal of predetermined polarity at said first terminal; means connecting said output terminal of said amplifier to said first terminal of said current flow control device; a direct current connection from a second terminal of said current flow control device to said input terminal of said amplifier; a direct current source connected to a third terminal of said device whereby said device conducts a current from said source in response to a signal of said predetermined polarity at said signal input terminal and is not responsive to a signal of opposite polarity at said signal input terminal; and a utilization device connected between said third terminal and said direct current source for detecting the current conducted by said current flow control device.

2. The rectifier circuit defined by claim 1 wherein said current flow control device is a bipolar transistor, wherein said first terminal is the base terminal, said second terminal is the emitter terminal and said third terminal is the collector terminal of said transistor.

3. The rectifier circuit defined by claim 1 wherein said current flow control device is a field effect transistor and when said first terminal is the gate terminal, said second terminal is the source terminal, and said third terminal is the drain terminal of said field effect transistor.

4. The combination defined by claim 1 including current averaging means connected to receive said current conducted by said current flow control device.

5. The rectifier circuit defined by claim 1 wherein said means connecting said output terminal of said amplifier to said first terminal of said current flow control device is a direct current connection.

6. The rectifier circuit defined by claim 1 wherein said means connecting said output terminal of said amplifier to said first terminal of said current flow control device is an alternating current connection.

7. The rectifier circuit defined by claim 1 wherein said means connecting said signal input terminal to said input terminal of said amplifier is an alternating current connection.

8. The rectifier circuit defined by claim 1 including a first impedance in said direct current connection from said terminal of said current flow control device to said input terminal of said amplifier, and a second impedance connected to said second terminal an in series with said current flow control device and said direct current source.

9. The rectifier circuit defined by claim 8 wherein said first impedance is substantially larger than said second impedance whereby said current flow control device provides a gain.

10. The combination defined by claim 1 further including a second current flow control device complementary to said first mentioned current flow control device, said second device having at least three terminals including a first terminal adapted to receive signals for controlling the flow of current through said second device; means connecting said output terminal of said amplifier to said first terminal of said second current flow control device; a direct current connection from a second terminal of said second flow control device to said input terminal of said amplifier; a second direct current source connected to a third terminal of said second flow control device whereby said second flow control device conducts a current from said second source in response to a signal of said opposite polarity at said signal input terminal and is not responsive to a signal of said predetermined polarity at said input terminal; and a second utilization device connected between said third terminal of said second flow control device and said second direct current source for detecting the current conducted by said second flow control device.

11. The combination defined by claim 10 wherein said current flow control devices are complementary transistors.

UNITED STATES PATENT OFFICE

CERTIFICATE OF CORRECTION

Patent No. 3,566,145 Dated 23 February 1971

Inventor(s) Edmund E. Goodale

It is certified that error appears in the above-identified patent and that said Letters Patent are hereby corrected as shown below:

Column 1, line 4, after "output" insert --signal--; line 48, "l gain-inverting" should be --high-gain inverting--; line 65, after "sho insert --with--; line 72, "Iin, input current Iin," should be --the inp current Iin,--; line 75, "cutoff" should be --cut off--; and line 75, "] should be --Ipin--.

Column 2, line 8, "cutoff" should be --cut off--;
'ines 54 and 58, "cutoff" should be --cut off--;
line 56, "position" should be --positive--; and line 58, "conduits" sh be --conducts--.

Column 3, line 16, "2500" should be --2000--; line 24, after "shown" insert --in--; and line 40, "amplifiers" should be --amplifie Column 4, line 8, "when" should be --wherein--; and line 30, "an" should be --and--.

Signed and sealed this 4th day of January 1972.

(SEAL)
Attest:

EDWARD M.FLETCHER,JR.
Attesting Officer

ROBERT GOTTSCHALK
Acting Commissioner of Patents